United States Patent
Hasegawa

(10) Patent No.: US 6,507,731 B1
(45) Date of Patent: Jan. 14, 2003

(54) WIRELESS COMMUNICATION APPARATUS WITH TRANSMISSION POWER CONTROLLER AND METHOD THEREOF

(75) Inventor: Osamu Hasegawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/448,143

(22) Filed: Nov. 24, 1999

(30) Foreign Application Priority Data

Nov. 26, 1998 (JP) .......................................... 10-335172

(51) Int. Cl.[7] ................................................ H03F 1/32
(52) U.S. Cl. ........................ 455/115; 455/126; 330/129; 330/149
(58) Field of Search ............................ 330/2, 129, 133, 330/135, 136, 149, 151, 179; 455/115, 126, 127

(56) References Cited

U.S. PATENT DOCUMENTS

| | | | |
|---|---|---|---|
| 5,126,687 A | * 6/1992 | Onoda et al. | 330/149 |
| 5,229,997 A | * 7/1993 | Hirata et al. | 370/104 |
| 5,455,537 A | * 10/1995 | Larkin et al. | 330/52 |
| 5,617,061 A | * 4/1997 | Fukuchi | 330/151 |
| 6,091,296 A | * 7/2000 | Rha | 330/149 |
| 6,175,270 B1 | * 1/2001 | Vannucci | 330/2 |
| 6,259,318 B1 | * 7/2001 | Mielke et al. | 330/129 |
| 6,275,105 B1 | * 8/2001 | Ghannouchi et al. | 330/151 |

FOREIGN PATENT DOCUMENTS

| | | |
|---|---|---|
| JP | 64-18817 | 1/1989 |
| JP | 03-133223 | 6/1991 |
| JP | 07-20964 | 1/1995 |
| JP | 08-56248 | 2/1996 |
| JP | 08-147065 | 6/1997 |
| JP | 09-186614 | 7/1997 |
| JP | 11-215198 | 8/1999 |

* cited by examiner

Primary Examiner—Thanh Cong Le
Assistant Examiner—James Ewart
(74) Attorney, Agent, or Firm—Sughrue Mion, PLLC

(57) ABSTRACT

An amplifier having a linear operation region and a nonlinear operation region amplifies a transmission signal. A linear compensation circuit compensates the amplifier for linearity when operating in the nonlinear operation region. The operation of the linear compensation circuit is controlled so as to substantially bring the linear compensation operation to a stop when the amplifier operates in the linear operation region.

25 Claims, 9 Drawing Sheets

WIRELESS COMMUNICATION APPARATUS WITH TRANSMISSION POWER CONTROLLER AND METHOD THEREOF

BACKGROUND OF THE INVENTION

1. Field of the Invention

The present invention relates to a wireless communication apparatus with a transmission power controller and method thereof, and in particular to a wireless communication apparatus and method capable of effectively reducing power to be consumed at transmission time.

2. Description of the Related Art

In a Code Division Multiple Access (CDMA) communication device, transmission power at a mobile station has to be controlled at 70 dB to provide a signal received at a base station at a predetermined power level, for solving the problem of mobile stations being at different distances to the base station or the like. Further, an amplifier is also required to operate in its linear region because the leakage power to adjacent channels cannot be neglected. Thus, the CDMA communication device is required to use a linear compensation circuit for allowing an amplifier to operate in the nonlinear region when high transmission power is required.

In a Personal Digital Cellular (PDC) system, which is the Japanese personal cellular phone standard system, transmission power control on the order of 20 dB is generally performed. In this power control, an amplifier is allowed to operate in the nonlinear operation region. In other words, for a small range of transmission output power control from a PDC or the like, an amplifier is controlled by changing a bias so as to operate at a bias point that provides the least distortion and best efficiency. By controlling the amplifier in this manner, electric current flowing during the idle operation (idle electric current) is minimized.

In this case, the transmission power characteristics of a PDC are as shown in FIG. 1. Namely, when the bias point changes from curve (a) to (d) in FIG. 1, transmission output power Pout changes from the maximum transmission output power (MAX Power) to a range of −15 to −20 dB relative to input power Pin as shown in FIG. 1. At this time, consumed current I also changes from curve (a)' to (d)' in FIG. 1 depending on this change in the bias point. In this changing consumed current I graph, the hatched portion in FIG. 1 is an idle current region. In consideration of the stability of an amplifier to suppress oscillation or the like, as shown in FIG. 1, the idle current can be reduced by the power control on the order of 15 dB.

When a linear compensation circuit is provided to carry out linear compensation at all times in a CDMA communication device, the consumed power increases by an amount corresponding to the linear compensation circuit. However, since some wireless communication devices such as mobile communication devices employ a battery as the electric source, it is desirable to reduce its consumed power as much as possible, thus leading to the longest possible duration of device operation. Thus, using a linear compensation circuit has the disadvantage of increasing consumed power and leads to a shortened duration of device operation.

SUMMARY OF THE INVENTION

The present invention solves these disadvantages of the related background art, and its object is to provide a consumed-power reduction circuit which is capable of effectively reducing the consumed power during transmission, as well as providing a wireless communication device and a linear operation control method using the same.

It is therefore an object of the present invention to provide a wireless communication apparatus and method capable of effectively reducing consumed power.

Another object of the present invention is to provide a wireless communication apparatus and method capable of effectively controlling linear compensation during non-linear operation of an amplifier.

In order to achieve the above objects, a wireless communication apparatus according to the present invention comprises an amplifier having a linear operation region and a nonlinear operation region, a linear compensation circuit for compensating said amplifier for linearity, and a control circuit for controlling said linear compensation circuit based on a control signal from a base station so as to substantially stop the linear compensation operation of said linear compensation circuit when said amplifier operates in the linear operation region of said amplifier.

In order to achieve the above objects, a method, according to the present invention, of reducing power to be consumed in a wireless communication apparatus having an amplifier with a linear operation region and a nonlinear operation region, and a linear compensation circuit for compensating for linearity of an amplifying operation in the nonlinear operation region of the amplifier, wherein the method includes detecting transmission power of the wireless communication apparatus, and substantially stopping operation of the linear compensation circuit when the transmission power is lower than a predetermined level determined by a control signal from a base station.

To further achieve the objects of the invention, another wireless communication apparatus according to the present invention is provided that comprises an amplifier for performing an amplifying operation in one of either a linear operation region and a nonlinear operation region according to transmission power of the wireless communication apparatus, a linear compensation circuit for compensating the amplifying operation for linearity when in the nonlinear operation region of the amplifier, and a control circuit for controlling operation of the linear compensation circuit when the transmission power is lower than a predetermined level determined by a control signal from a base station.

To still further achieve the objects of the invention, another method according to the present invention is provided, of reducing power to be consumed in a wireless communication apparatus having an amplifier with a linear operation region and a nonlinear operation region and a linear compensation circuit for compensating an amplifying operation of the amplifier for linearity, the method comprises detecting transmission power of the wireless communication apparatus and controlling the linear compensation circuit so as to stop a linear compensation operation of the linear compensation circuit when the transmission power is lower than a predetermined first level determined by a control signal from a base station and to activate the linear compensation operation of the linear compensation circuit when the transmission power exceeds a predetermined second level which is determined by a control signal from a base station and is larger than the predetermined first level.

BRIEF DESCRIPTION OF THE DRAWINGS

These and other objects, features and advantages of this invention will become more fully apparent from the following detailed description taken with the accompanying drawings in which.

DETAILED DESCRIPTION OF THE PREFERRED EMBODIMENTS

Figure 1:
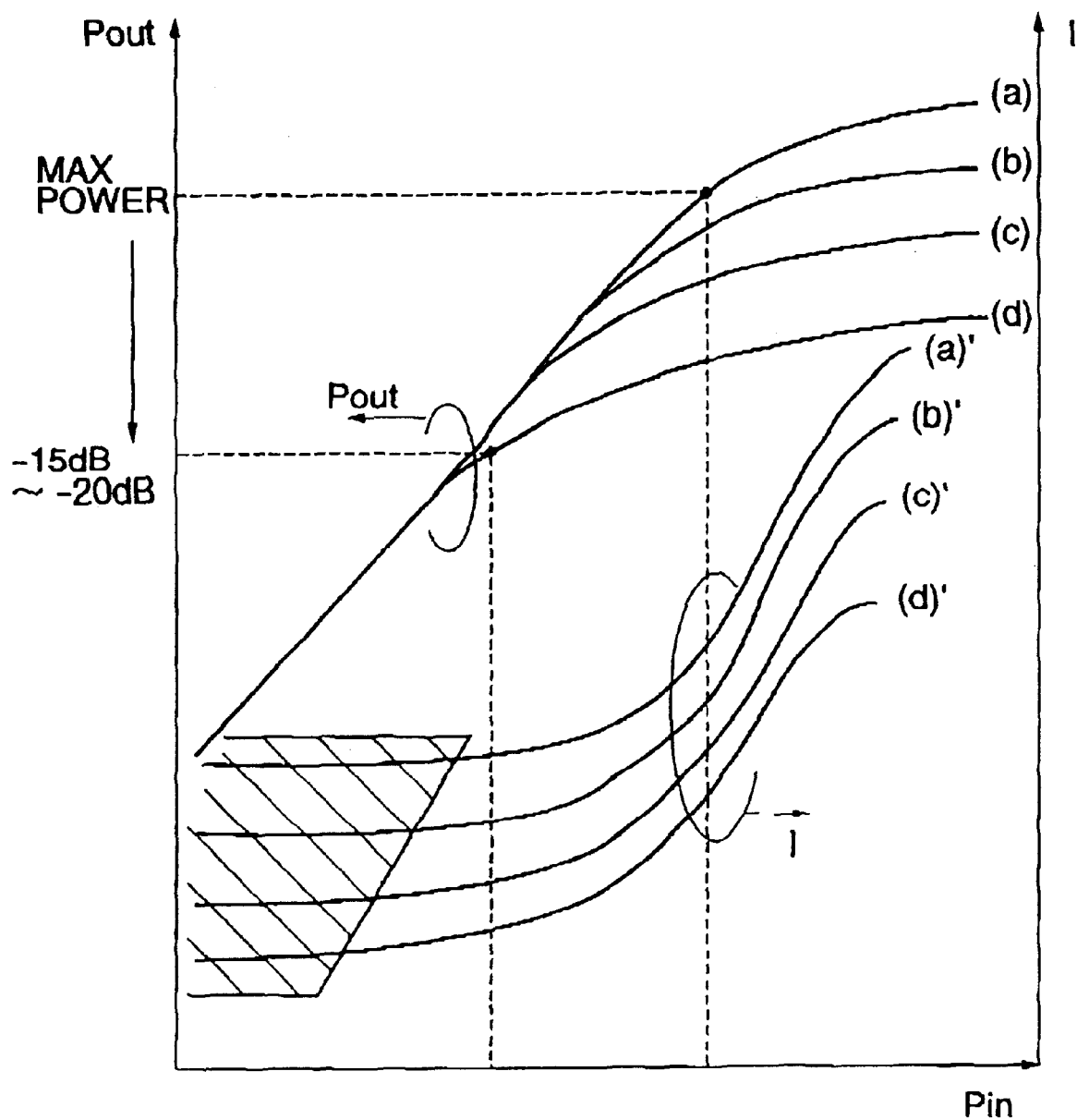
FIG. 1 is a graph showing the transmission power characteristics of a conventional personal cellular phone system.

Next, preferred embodiments of the present invention will be described referring to the drawings. Incidentally, like symbols shown in one of the drawings are attached to parts similar to those of other drawings.

Figure 2:
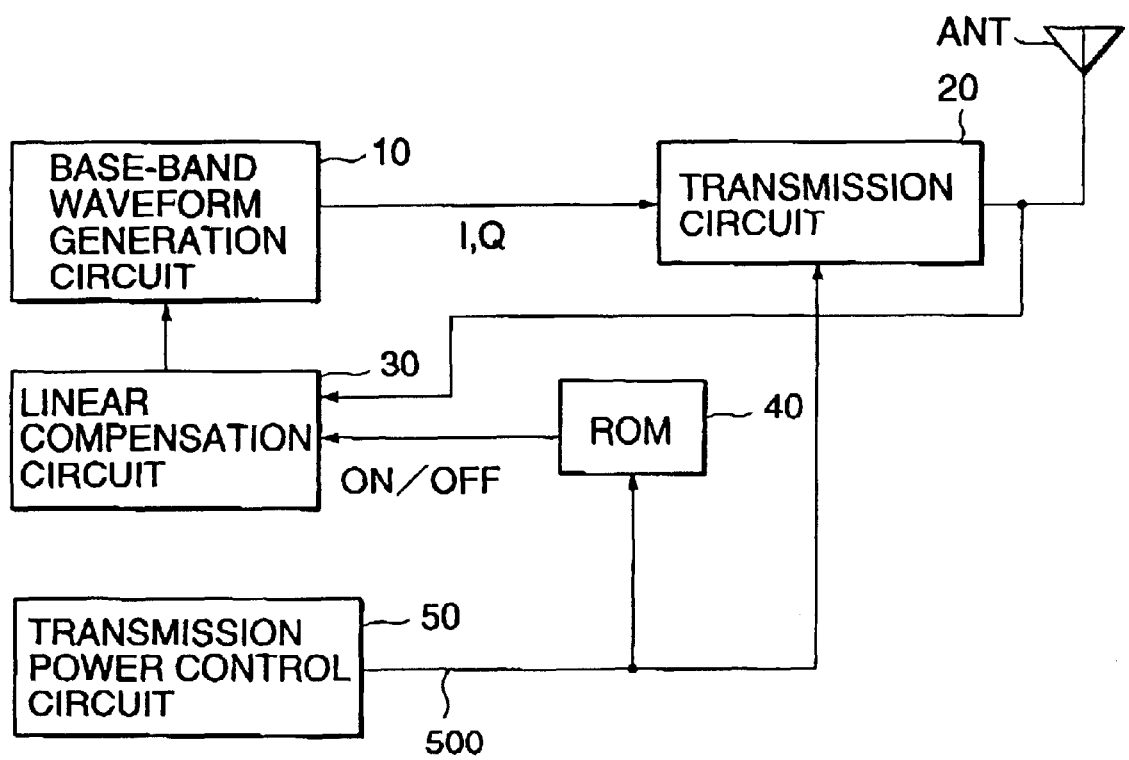
FIG. 2 is a block diagram showing a wireless communication apparatus according to the present invention.

One embodiment of a wireless communication apparatus, such as a personal cellular phone or other mobile communication device with a consumed-power reduction function according to the present invention, is shown in FIG. 2. In FIG. 2, the wireless communication apparatus comprises a base-band waveform generation circuit 10 for generating a waveform of a base-band signal, a transmission circuit 20 for receiving an I signal and a Q signal as orthogonal signals from the base-band waveform generation circuit 10 and outputting a transmission signal, a transmission power control circuit 50 for controlling the transmission power of the transmission signal from the transmission circuit 20, a Read Only Memory (ROM) 40 in which data according to the transmission power control signal 500 for controlling the transmission power is stored, and a linear compensation circuit 30 for compensating the nonlinearity of an unshown amplifier in the transmission circuit 20 under ON/OFF control according to the data (ON/OFF) read out from the ROM 40, where ANT denotes an antenna that transmits a CDMA signal to another device such as a base station and receives a CDMA signal from another device such as a base station. The amplifier in the transmission circuit 20 has a linear operation region in which the transmission power is smaller than a predetermined level and a nonlinear operation region in which the transmission power is greater than the predetermined level.

In FIG. 2, a Predistortion Type linear compensation circuit 30 can be used. Phase information for canceling a distorted component occurring at the final stage of the amplifier is provided from the linear compensation circuit 30 to the base-band waveform generation circuit 10 to compensate for linearity. Incidentally, for transmission power below a predetermined level, the final-stage amplifier operates in a linear operation region. Accordingly, when an operation proceeds in this linear operation region, phase information for canceling the distorted component occurring at the final stage is not to be given to the base-band waveform generator circuit 10. Then, in accordance with data read out from the ROM 40, the operation of the linear compensation circuit 30 is controlled to be substantially at rest.

More specifically, the following control is carried out. Namely, a switching circuit is provided at an unshown power source input stage of the linear compensation circuit 30. And, a transmission power control signal 500 is given to the ROM 40 from the transmission power control circuit 50 and data corresponding to the transmission power control signal 500 is read out from the ROM 40. In accordance with data read out from the ROM 40, the switching circuit is controlled to be at the OFF state. If data read out from the ROM comprises 8 bits and a value of the highest bit thereof is "0", for example, the switching circuit is controlled to turn OFF. If the value of the highest bit thereof is "1", the switching circuit is controlled to turn ON.

In other words, if the value of the transmission power control signal 500 given to the ROM 40 as an address is below a predefined threshold value, data with a value having its highest, or most significant bit equal to "0", having been previously written into the ROM 40 at that address, is output. If the value of the transmission power control signal 500 given to the ROM 40 as an address is above the predefined threshold value, data with a value having its highest bit equal to "1", having previously written into the ROM 40 at that address, is output. Depending on the configuration of a switching circuit, however, the values of the highest bit in the data recorded in the ROM 40 can be defined opposite to that discussed above, as "1" and "0", respectively. That is, data with a value with its highest bit equal to "0" or "1" may be stored in the ROM for a value of data greater or smaller than a threshold value, respectively.

Alternatively, the linear compensation circuit 30 may control a transmission circuit 20 rather than a base-band waveform generator circuit 10. Even in such cases, the control need only be made so as to substantially stop the operation of a linear compensation circuit 30 when the amplifier operates in the linear operation region.

In essence, it is necessary to write such information for controlling the switching circuit into the ROM 40 so as to substantially stop the operation of the linear compensation circuit 30 in the linear operation region of an amplifier. Incidentally, if the transmission power control signal 500 is an analog signal, it is necessary to have an analog/digital conversion circuit provided at the input stage of the ROM 40 and to input the resultant digital data into the ROM 40 after the conversion by means of the analog/digital conversion circuit.

Figure 3:
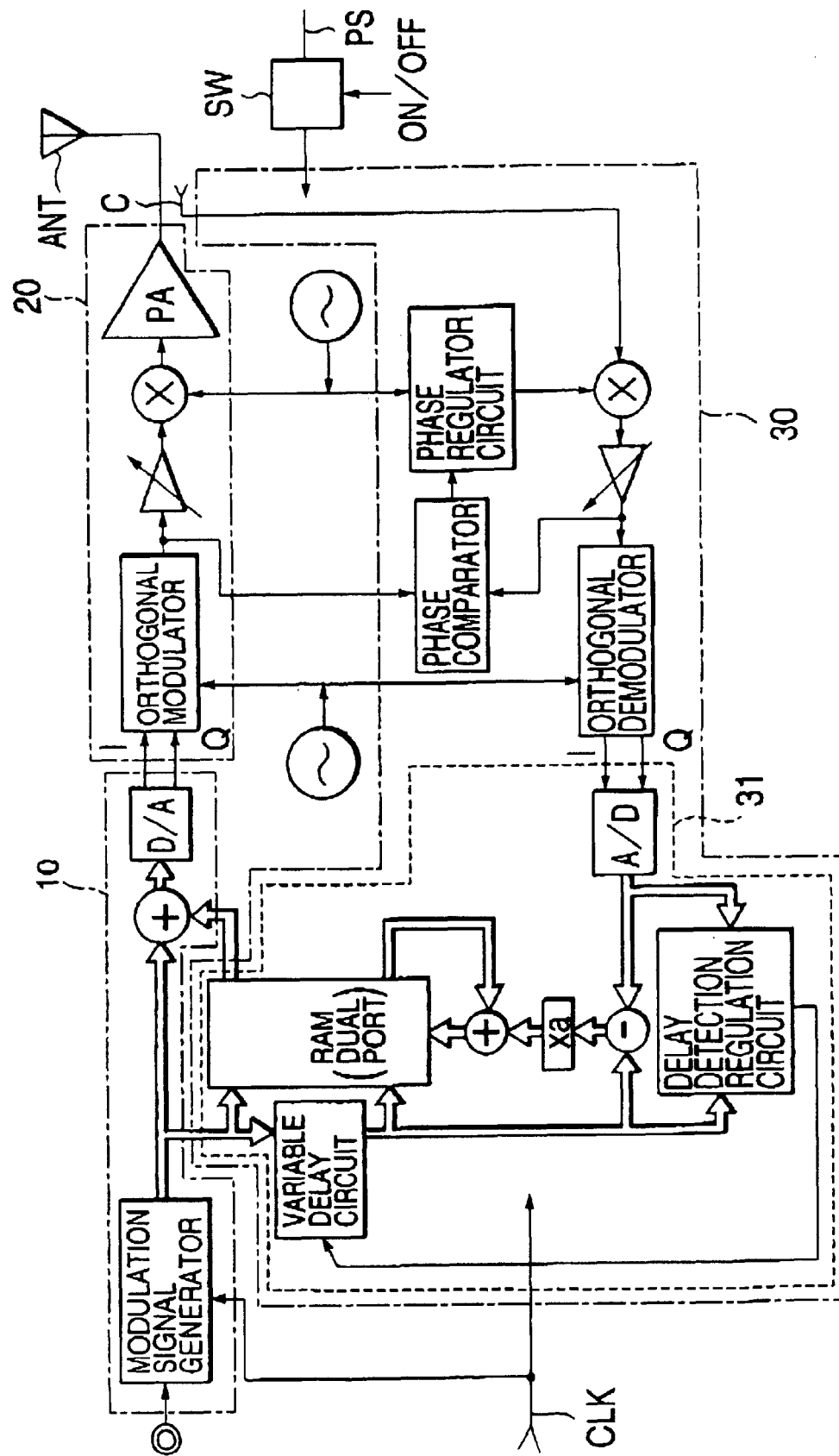
FIG. 3 is a diagram showing one embodiment of the linear compensation circuit according to the wireless communication apparatus shown in FIG. 2.
Figure 4:
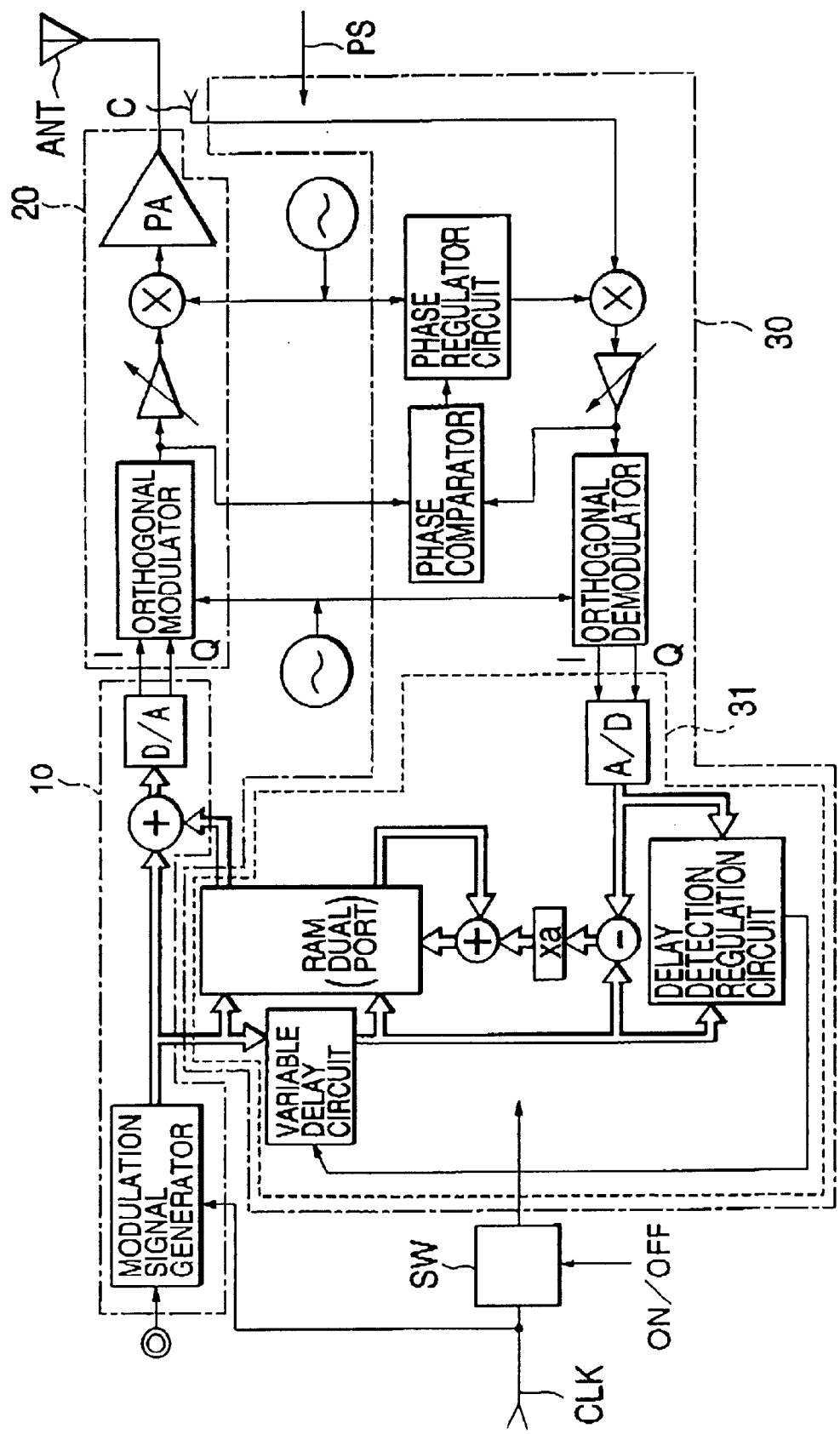
FIG. 4 is a diagram showing another embodiment of the linear compensation circuit according to the wireless communication apparatus shown in FIG. 2.

Next, the linear compensation circuit 30 having a Predistortion Type circuit is shown in FIG. 3. In this case, it is necessary to have a switching circuit SW provided at the input stage of the power supply source PS and to provide ON/OFF control in accordance with the transmission power control signal (ON/OFF) from the ROM 40. Furthermore, if the linear compensation circuit 30 has a digital circuit portion 31, such as a Predistortion Type circuit, a switching circuit SW can also be provided at the input stage of the clock CLK as shown in FIG. 4. The switching circuit SW controls the clock supply to the relevant circuit portion so the clock CLK is either supplied or not supplied to that circuit portion.

Incidentally, in FIGS. 3 and 4, a transmission signal is input to the linear compensating circuit 30 via the coupler C, while the base-band waveform generator circuit 10 is so controlled in accordance with an output of this linear compensation circuit 30 as to accomplish a linear compensating operation.

Figure 5:
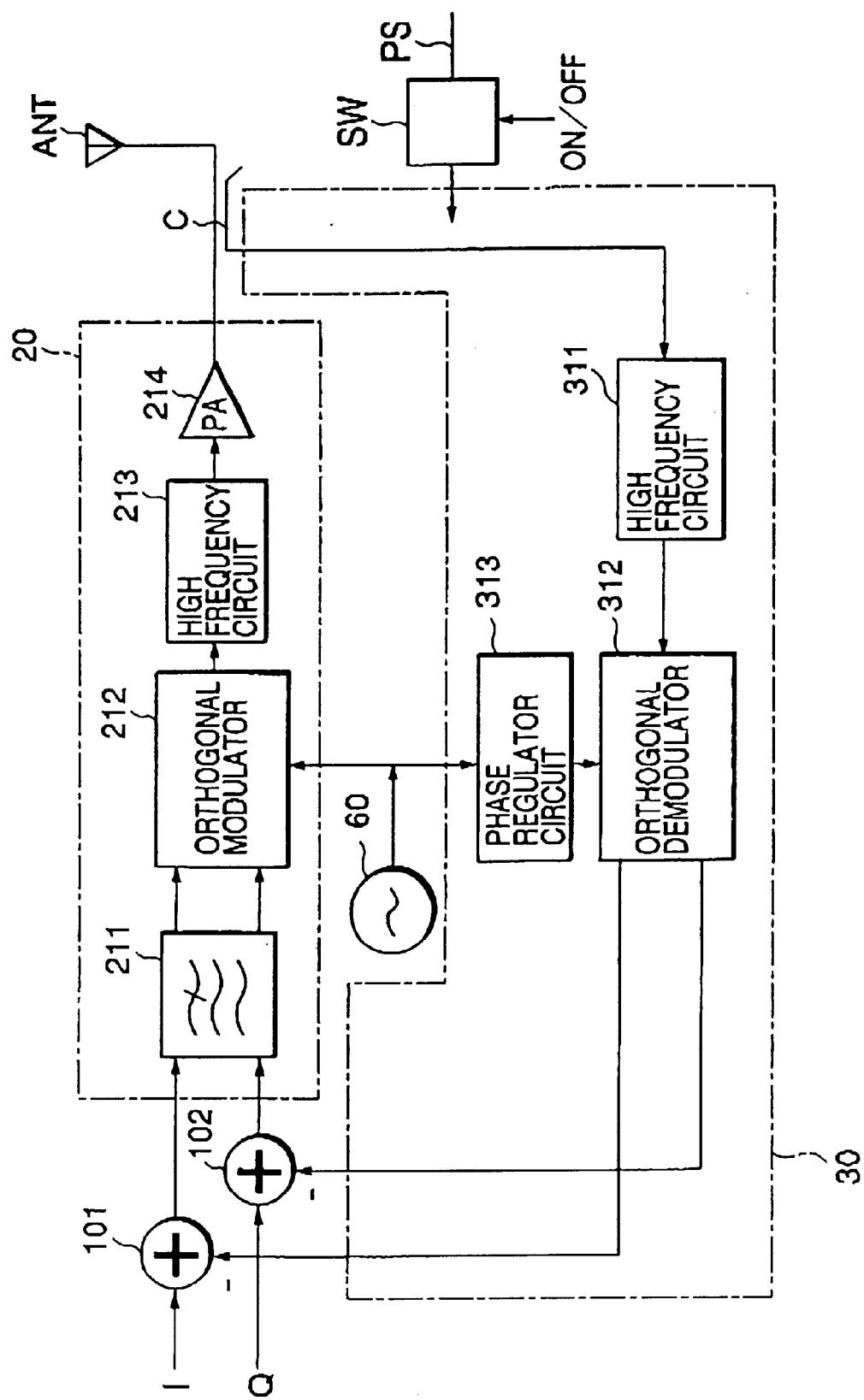
FIG. 5 is a diagram showing still another embodiment of the linear compensation circuit according to the wireless communication apparatus shown in FIG. 2.

In FIG. 5, the linear compensating circuit 30 employs a Cartesian Loop Type compensation circuit. In this case, it is also necessary to have a switching circuit SW provided at the input stage of the power source PS for the relevant circuit to provide ON/OFF control in accordance with the transmission power control signal (ON/OFF) from the ROM 40. In FIG. 5, a transmission signal is input to the linear compensation circuit 30 via a coupler C. In the linear compensation circuit 30, a high frequency circuit 311 and an orthogonal demodulator 312 generate orthogonal control signals corresponding to the I signal and the Q signal. The control signals are added to the I signal and the Q signal by adder circuits 101 and 102.

In the transmission circuit 20, the I signal and the Q signal input via the adder circuits 101 and 102 are input to the orthogonal modulator 212 via a low-pass filter 211. Then, a radio signal is generated by the high frequency circuit 213 and the power amplifier (PA) 214 and output from the antenna ANT.

Incidentally, in FIG. 5, an oscillator signal output from the local oscillator 60 is input not only to the orthogonal modulator 212 but also to the orthogonal demodulator 312 via the phase regulator circuit 313.

In other words, an I signal and a Q signal input to the transmission circuit 20 are so controlled in accordance with a control signal output from the linear compensation circuit 30 as to accomplish a linear compensating operation.

In essence, it is necessary to only substantially put the operation of the linear compensation circuit 30 to a stop when the final-stage amplifier operates in the linear operation region. For this linear compensation circuit 30, a Polar Loop Type linear compensation circuit or a Feedforward Type linear compensation circuit are examples of other circuits that may be used in addition to the Cartesian Loop Type linear compensation circuit and the Predistortion Type linear compensation circuit as mentioned above. And it is necessary either to set the power supply servicing these circuits to the break state so power is not supplied to these circuits or to set the clock supply servicing the digital circuit portion of these circuits so as to discontinue supply of the clock signal to these circuits. Setting the power supply to discontinue supplying power enables the operation of the entire linear compensation circuit to be stopped and the power consumption of the entire circuit to be reduced. Besides, even if the analog circuit portion of an orthogonal demodulator or the like operates, stopping the clock from being supplied to the digital circuit portion enables the power consumption corresponding to the digital circuit portion to be reduced.

Figure 6:
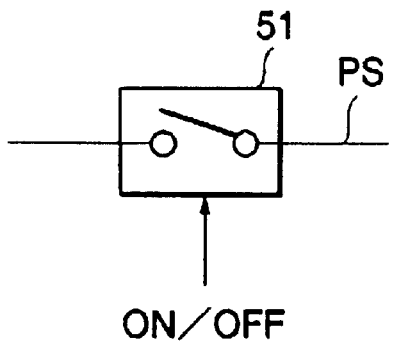
FIG. 6 is an illustration showing one example of the switching circuit (SW) according to the wireless communication apparatus shown in FIGS. 3 and 5.

Here, switching circuits SW shown in FIGS. 3 and 5 will be described in FIG. 6. In FIG. 6, the switching circuit SW comprises a mechanical relay switch 51. Its contact is turned ON/OFF in accordance with a transmission power control signal (ON/OFF) from the ROM 40.

Figure 7:
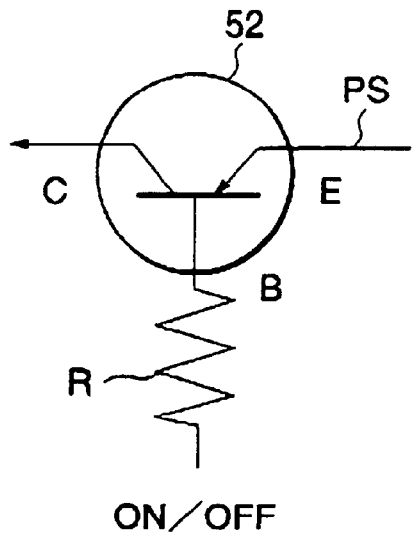
FIG. 7 is an illustration showing another embodiment of the switching circuit (SW) according to the wireless communication apparatus shown in FIGS. 3 to 5.
Figure 8:
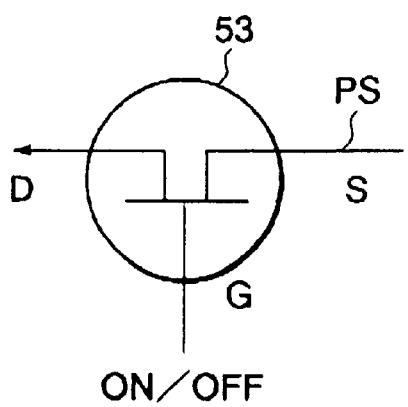
FIG. 8 is an illustration showing still another embodiment of the switching circuit (SW) according to the wireless communication apparatus shown in FIGS. 3 to 5.

Since the provision of a relay switch 51 in a wireless communication apparatus such as mobile phone hinders the apparatus from being made small or lightened in weight, it is preferred to employ semiconductor switches as shown in FIGS. 7 and 8.

First, in the example shown in FIG. 7, the switching circuit SW comprises a PNP type transistor 52. Transistor 52 turns ON if the transmission power control signal (ON/OFF) applied to the base terminal B via a resistor R is a low level and turns OFF if it is a high level. In this manner, it is necessary to allow the transistor 52 to switch in accordance with a transmission power control signal (ON/OFF) from the ROM 40.

Alternatively, in the example shown in FIG. 8, the switching circuit SW can comprise a P-channel Metal Oxide Semiconductor Field Effect Transistor (MOSFET) 53. The MOSFET turns ON if the transmission power control signal (ON/OFF) applied to the gate terminal G is a low level and turns OFF if it is a high level. In this manner, it is necessary to allow the transistor 53 to switch in accordance with a transmission power control signal (ON/OFF) from the ROM 40.

Incidentally, since no current needs to flow through the switching circuit SW shown in FIG. 4, only a well-known analog switch need be used.

As mentioned above, the linear compensation is so controlled as to become substantially at rest when transmission power is lower than a predetermined level, thereby enabling the power consumption to be reduced by the power consumption corresponding to the linear compensation circuit. Thus, in a wireless communication device with a battery employed for the power source of a mobile phone or the like, the power consumption can be reduced and the service life of the battery can be prolonged.

Figure 9:
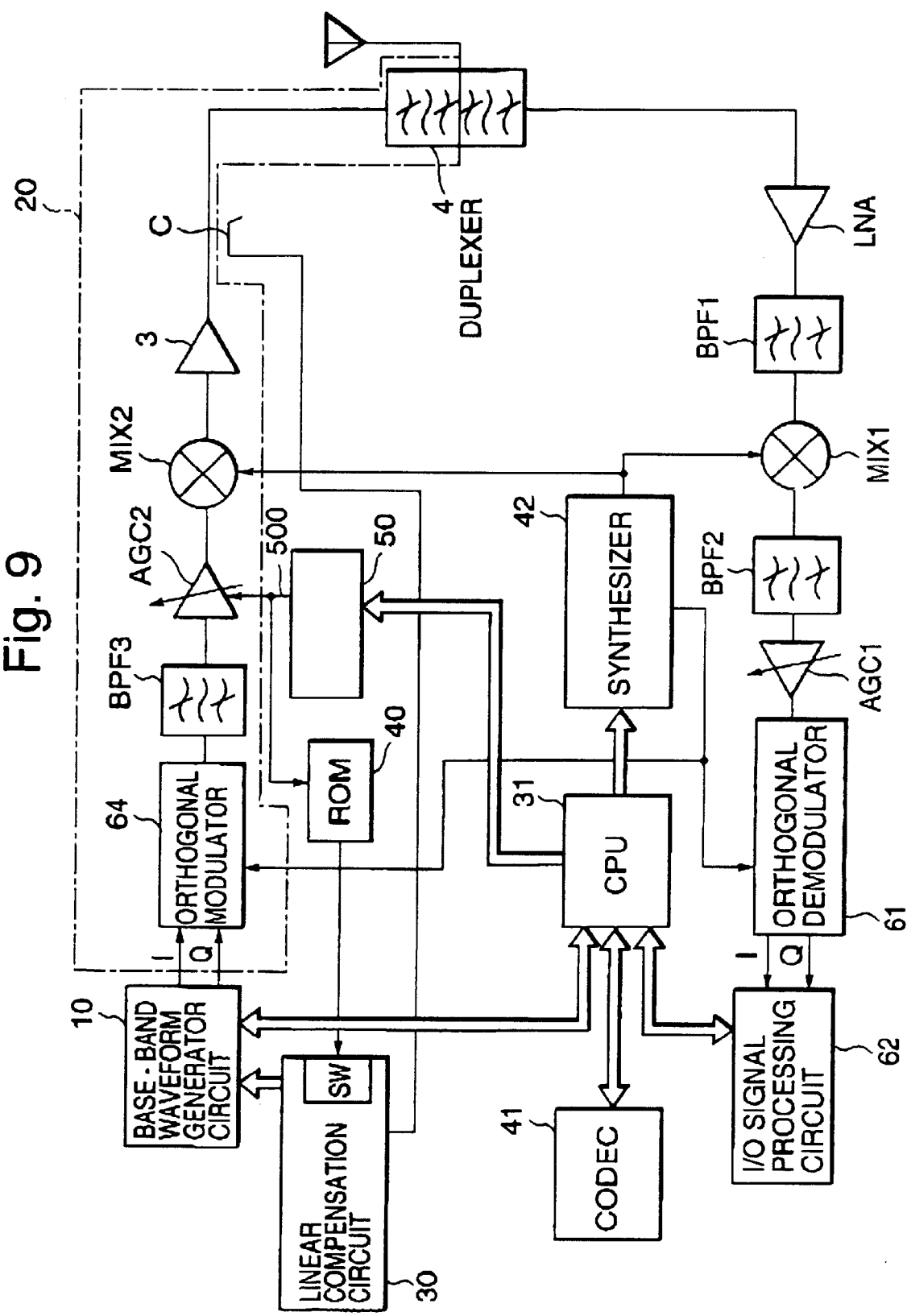
FIG. 9 is a diagram showing a more specific configuration of the wireless communication apparatus as shown in FIG. 2.

Referring to FIG. 9, the wireless communication apparatus having a device for reducing the power consumption as described above will be explained.

In FIG. 9, a control signal from an unshown base station is demodulated into an I signal and a Q signal as orthogonal signals by passage through a duplexer 4, an low-noise amplifier (LNA), a band pass filter BPF1, a mixer MIX1, a band pass filter BPF2, an AGC amplifier AGC1 and an orthogonal demodulator 61, in sequence. These demodulated I and Q signals are processed by means of an I/Q signal processing circuit 62 in order to regenerate the original control signal transmitted from the base station. The control signal, after this processing, is supplied to a main control circuit (CPU) 31.

In accordance with the control signal from the base station, the main control circuit (CPU) 31 specifies a transmission power level to a power control circuit 50. Incidentally, a received signal is given to an encoder/decoder (CODEC) 41 through a route similar to that of the above control signal to be demodulated and decoded.

A transmission signal is coded by means of the CODEC 41 and transmitted via the base-band waveform generator circuit 10 and the transmission circuit 20.

The transmission circuit 20 comprises an orthogonal modulator 64 for providing an orthogonal modulation by using the I and Q signals output from the base-band wave generator circuit 10, a band pass filter BPF3 for allowing only signals within a predefined band to pass, an automatic gain control (AGC) amplifier AGC2 for providing control to keep the gain constant in accordance with a transmission control signal 500 from the power control circuit 50, a mixer MIX2 for superposing an output of this AGC amplifier AGC2 onto a local oscillator signal, a power amplifier 3 for providing power amplification by means of an FET element and a duplexer 4.

Under control of the main control circuit 31, the synthesizer 42 sends out a local oscillator signal to the mixers MIX1 and MIX2 or sends out other oscillator signals to the orthogonal demodulator 61 and the orthogonal modulator 64.

A transmission signal is input to the linear compensation circuit 30 via the coupler C. In the linear compensation circuit 30, the above-mentioned operation is carried out. Namely, the main control circuit 31 specifies a transmission power level to the power control circuit 50. And then, for transmission power below a predetermined level, ON/OFF control of the switching circuit SW within the linear compensation circuit 30 is performed by the data read out from the ROM 40 in accordance with a transmission power control signal 500 from the power control circuit 50. If the switching circuit SW is controlled to turn OFF, as mentioned above, either the power supply or the clock supply to the linear compensation circuit 30 is brought to a stop. Thereby, the linear compensation circuit 30 becomes substantially at rest or stopped. In this manner, a linear compensation circuit 30 is so controlled as to become substantially at rest or stopped, thereby enabling the power consumption to be reduced by the amount corresponding to that attributable to the linear compensation circuit 30.

To sum up, the wireless communication apparatus shown in FIG. 9 comprises a transmission circuit 20 for performing an amplifying operation having both a linear operation region and a nonlinear operation region to perform wireless communication, and a linear compensation circuit 30 for performing a linear compensating operation for compensating for the linearity of an amplifying operation while in the nonlinear operation region of the transmission circuit 20, and is controlled to substantially bring the operation of the linear compensation circuit 30 to a stop when in the nonlinear operation region of the transmission circuit 20. Then, in the linear compensation circuit's 30 operational stop state, the transmission power of the wireless communication apparatus is detected and the power supply from a power source circuit (unshown) that supplies at least the power for allowing a linear compensating operation to proceed is so controlled as to be discontinued or the clock supply for allowing a linear compensating operation to proceed is controlled similarly in accordance with this detected transmission power.

Figure 10A:
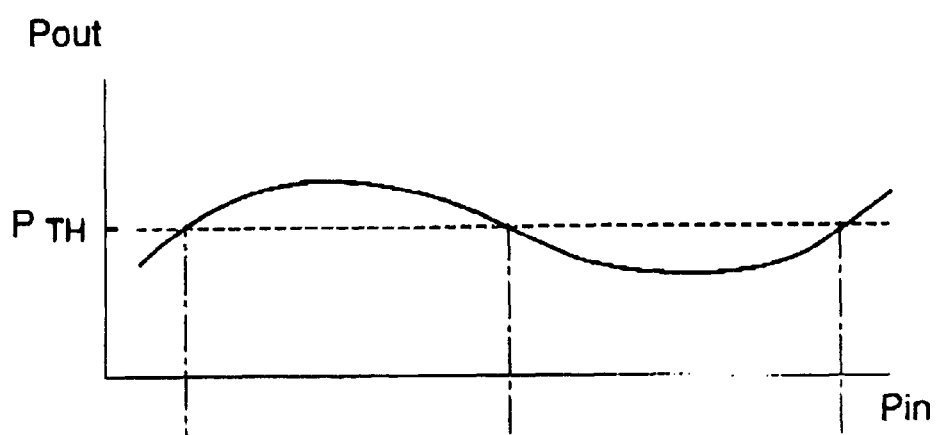
FIGS. 10A and 10B are graphs showing the ON/OFF operation of a linear compensation circuit by means of a switching circuit (SW).
Figure 10B:
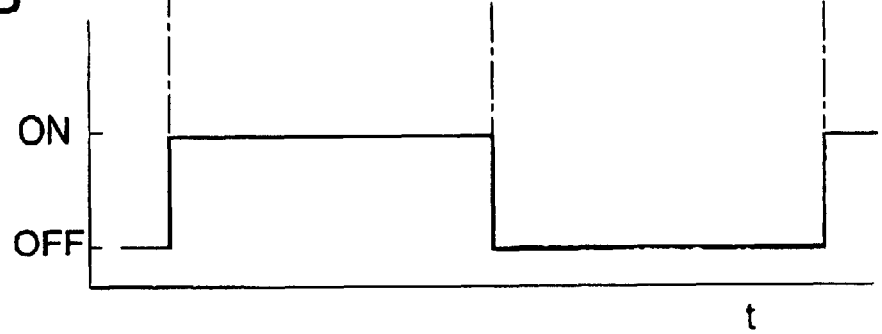

Meanwhile, for a transmission power below a predetermined level, as described above, a linear compensation circuit 30 is so controlled as to become substantially at rest. The relation between the transmission power and the operation state of the linear compensation circuit 30 is shown in FIGS. 10A and B. For an input power Pin changing over time, the transmission power Pout is assumed to have changed as shown in FIG. 10A. Then while the transmission power Pout is greater than a threshold value P TH, the linear compensation circuit 30 remains OFF as shown in FIG. 10B. On the other hand, while the transmission power Pout is smaller than the threshold value P TH, the linear compensation circuit 30 remains ON as shown in FIG. 10B. Accordingly, when the transmission power Pout varies so as to increase and decrease near the threshold value P TH, the linear compensation circuit 30 frequently repeats ON/OFF.

Such being the case, if necessary, two mutually different levels of threshold values are set up as a lower threshold level and a higher threshold level and a linear compensation circuit 30 has only to be so controlled as to turn OFF if the transmission power Pout becomes smaller than the lower threshold level and as to be kept OFF until the transmission power Pout exceeds the higher threshold level once the circuit turns OFF. Here, a linear compensation circuit 30 has only to be controlled to turn ON if the transmission power Pout exceeds the higher threshold level and has to be kept ON until the transmission power Pout falls below the higher threshold level once the circuit turns ON. In this manner, when allowed to proceed under such hysteresis control, the ON/OFF operation of the linear compensation circuit 30 is not frequently repeated even for fluctuations that increase and decrease in transmission power Pout near the threshold P TH, and the operation of the linear compensation circuit 30 is stabilized.

In the above communication device, the following linear operation control method is performed. Namely, a transmission signal is amplified, the amplifying operation is compensated for linearity in the linear compensation circuit, the transmission power is detected when a transmission signal is transmitted, the detected value of transmission power is compared with a predetermined value and control is provided to substantially bring the operation of the linear compensation circuit to a stop if the value of transmission power is smaller than the predetermined value as a result of this comparison. In order to substantially bring the operation of the linear compensation circuit to a stop, the supply of power or a clock to the linear compensation circuit is discontinued.

Figure 11:
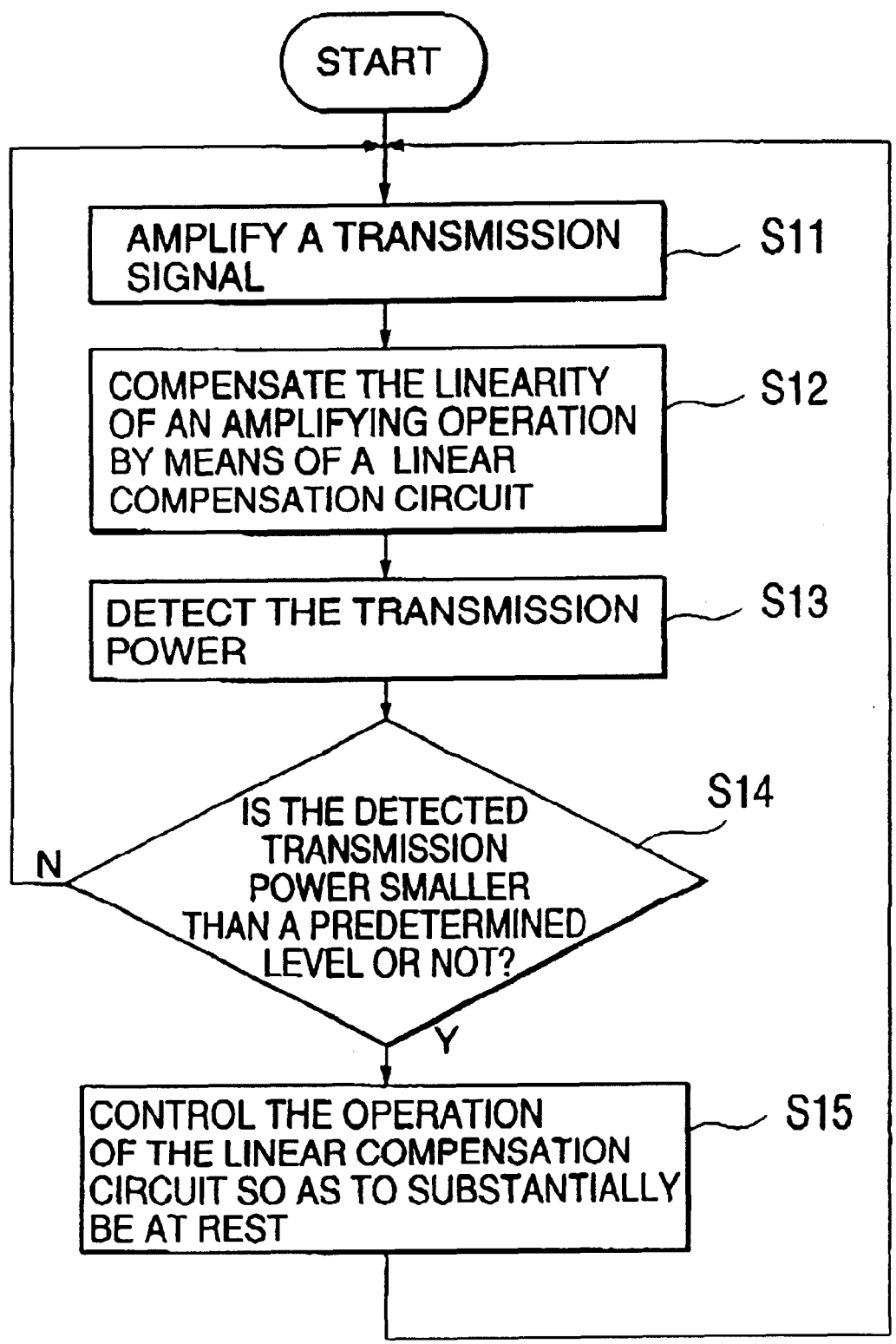
FIG. 11 is a flow chart showing a linear operation control method according to an embodiment of the present invention.

This method will be described referring to the flowchart of FIG. 11. In the linear operation control method of the wireless communication apparatus of the present invention, as shown in FIG. 11, a transmission signal is first amplified (step S11). Next, the linearity of this amplifying operation is compensated by the linear compensation circuit (step S12).

The transmission power is detected at the time of transmitting a transmission signal (step S13). This detected value of transmission power is compared with a predetermined value and based on this comparison it is determined whether or not the transmission power value is smaller than the predetermined value (step S14). If the transmission power value is smaller than the predetermined value, control is provided to substantially bring the operation of the linear compensation circuit to a stop (step S15). If not, the amplifying operation continues (step S15→S11). At step S15 in FIG. 11, the power supply or the clock supply is discontinued to substantially bring the operation of the linear compensation circuit to a stop.

The invention may be embodied in other specific forms without departing from the spirit or essential characteristics thereof. The preferred embodiments of the present invention described here are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A wireless communication apparatus comprising:
    an amplifier having a linear operation region and a nonlinear operation region;
    a linear compensation circuit for compensating said amplifier for linearity; and
    a control circuit for controlling said linear compensation circuit based on a control signal from a base station so as to substantially stop the linear compensation operation of said linear compensation circuit when said amplifier operates in the linear operation region of said amplifier.

2. A wireless communication apparatus as claimed in claim 1, wherein said control circuit comprises:

a transmission power control circuit for outputting a transmission power control signal for controlling transmission power; and a switch circuit for controlling power which is supplied to at least said linear compensation circuit in accordance with said transmission power control signal.

3. A wireless communication apparatus as claimed in claim 2, wherein said switch circuit stops said power from being supplied when said amplifier operates in said linear operation region.

4. A wireless communication apparatus as claimed in claim 2, wherein said switch circuit comprises a mechanical switch.

5. A wireless communication apparatus as claimed in claim 2, wherein said switch circuit comprises a semiconductor switch.

6. A wireless communication apparatus as claimed in claim 1, wherein said control circuit causes said linear compensation circuit to stop performing linear compensation when the amplifier operates in the linear region.

7. A wireless communication apparatus comprising:

an amplifier having a linear operation region and a nonlinear operation region;

a linear compensation circuit for compensating said amplifier for linearity;

a control circuit for controlling said linear compensation circuit so as to substantially stop the linear compensation operation of said linear compensation circuit when said amplifier operates in the linear operation region of said amplifier;

a transmission power control circuit for outputting a transmission power control signal based on transmission power; and a switch circuit for controlling a clock supplied to at least said linear compensation circuit in accordance with said transmission power control signal.

8. A wireless communication apparatus as claimed in claim 7, wherein said switch circuit stops said clock from being supplied when said amplifier operates in said linear operation region.

9. A wireless communication apparatus as claimed in claim 1, wherein said linear compensation circuit is a Cartesian loop type linear compensation circuit.

10. A wireless communication apparatus as claimed in claim 1, wherein said linear compensation circuit is a polar loop type linear compensation circuit.

11. A wireless communication apparatus as claimed in claim 1, wherein said linear compensation circuit is a feed-forward type linear compensation circuit.

12. A wireless communication apparatus as claimed in claim 1, wherein said linear compensation circuit is a predistortion type linear compensation circuit.

13. A wireless communication apparatus as claimed in claim 1, wherein the apparatus operates in a code division multiple access (CDMA) system.

14. A wireless communication apparatus as claimed in claim 1, further comprising:

a orthogonal modulator for orthogonal-modulating a transmission signal before said amplifier amplifies said transmission signal; and a orthogonal demodulator for orthogonal-demodulating a received signal included in said linear compensation circuit.

15. A method of reducing power to be consumed in a wireless communication apparatus having an amplifier with a linear operation region and a nonlinear operation region and a linear compensation circuit for compensating for linearity of an amplifying operation when the amplifier operates in said nonlinear operation region, the method comprising:

detecting transmission power of the wireless communication apparatus; and substantially stopping operation of the linear compensation circuit when said transmission power is lower than a predetermined level, wherein said transmission power is determined by a control signal from a base station.

16. A method as claimed in claim 15, wherein said amplifier operates in the linear operation region when said transmission power is lower than said predetermined level.

17. A method as claimed in claim 15, wherein supply of power from a power source to the linear compensation circuit stops in accordance with said transmission power.

18. A method of reducing power to be consumed in a wireless communication apparatus having an amplifier with a linear operation region and a nonlinear operation region and a linear compensation circuit for compensating for linearity of an amplifying operation when the amplifier operates in said nonlinear operation region, the method comprising:

detecting transmission power of the wireless communication apparatus; and substantially stopping operation of the linear compensation circuit in accordance with said transmission power, wherein supply of a clock, for allowing the linear compensation circuit to operate stops in accordance with said transmission power.

19. A method as claimed in claim 15, wherein said wireless communication apparatus includes a code division multiple access (CDMA) device.

20. A wireless communication apparatus comprising:

an amplifier for performing an amplifying operation in one of either a linear operation region and a nonlinear operation region according to transmission power of the wireless communication apparatus;

a linear compensation circuit for compensating the amplifying operation for linearity when the amplifier operates in said nonlinear operation region; and a control circuit for controlling operation of said linear compensation circuit when said transmission power is lower than a predetermined level, wherein said transmission power is determined by a control signal from a base station.

21. A wireless communication apparatus as claimed in claim 20, wherein said control circuit renders said linear compensation circuit in an ON-state when said transmission power exceeds said predetermined level and renders said linear compensation circuit in an OFF-state when said transmission power is lower than said predetermined level.

22. A wireless communication apparatus as claimed in claim 21, wherein said amplifier operates in said nonlinear operation region when said transmission power exceeds said predetermined level.

23. A wireless communication apparatus comprising, an amplifier for performing an amplifying operation in one of either a linear operation region and a nonlinear operation region according to transmission power of the wireless communication apparatus;

a linear compensation circuit for compensating the amplifying operation for linearity when the amplifier operates in said nonlinear operation region; and a control circuit for controlling operation of said linear compensation circuit according to said transmission power, wherein said operation of said linear compensation circuit is controlled by said control circuit with hysteresis according to said transmission power.

24. A wireless communication apparatus as claimed in claim 23, wherein said control circuit renders said linear compensation circuit in an ON-state when said transmission power exceeds a predetermined first level and renders said linear compensation circuit in an OFF-state when said transmission power is lower than a predetermined second level, wherein the predetermined second level is smaller than said predetermined first level.

25. A method of reducing power to be consumed in a wireless communication apparatus having an amplifier with a linear operation region and a nonlinear operation region and a linear compensation circuit for compensating an amplifying operation of the amplifier for linearity, the method comprising:

detecting transmission power of the wireless communication apparatus; and controlling the linear compensation circuit so as to stop a linear compensation operation of the linear compensation circuit when said transmission power is lower than a predetermined first level, wherein said transmission power is determined by a control signal from a base station, and to activate the linear compensation operation of the linear compensation circuit when said transmission power exceeds a predetermined second level, wherein said predetermined second level is larger than said predetermined first level.

\* \* \* \* \*